(12) United States Patent
Bird et al.

(10) Patent No.: US 6,719,038 B2
(45) Date of Patent: Apr. 13, 2004

(54) HEAT REMOVAL SYSTEM

(75) Inventors: John Bird, Newton, NH (US); Ralph I. Larson, Bolton, MA (US); Lyne Doré North, Chelmsford, MA (US); Paul Bussiere, Twin Mountain, NH (US); Amy Allen, Amesbury, MA (US)

(73) Assignee: Celestica International Inc., Toronto (CA)

( * ) Notice: Subject to any disclaimer, the term of this patent is extended or adjusted under 35 U.S.C. 154(b) by 0 days.

(21) Appl. No.: 10/215,320

(22) Filed: Aug. 8, 2002

(65) Prior Publication Data

US 2003/0029602 A1 Feb. 13, 2003

Related U.S. Application Data

(60) Provisional application No. 60/311,215, filed on Aug. 9, 2001.

(51) Int. Cl.$^7$ ................................................. F28F 7/00
(52) U.S. Cl. ...................... 165/80.3; 165/185; 165/121; 361/697; 257/722
(58) Field of Search ............................... 165/80.3, 121, 165/122, 185, 104.34, 104.33; 361/697, 695, 687, 690; 257/714, 722

(56) References Cited

U.S. PATENT DOCUMENTS

| | | | |
|---|---|---|---|
| 5,077,601 A | | 12/1991 | Hatada et al. |
| 5,107,398 A | * | 4/1992 | Bailey .................. 165/80.3 |
| 5,132,780 A | * | 7/1992 | Higgins, III ............ 165/80.3 |
| 5,218,514 A | * | 6/1993 | Huynh et al. ........... 165/80.3 |
| 5,309,318 A | * | 5/1994 | Beilstein, Jr. et al. .. 165/104.33 |
| 5,570,740 A | * | 11/1996 | Flores et al. .......... 165/104.34 |
| 5,597,035 A | * | 1/1997 | Smith et al. ............ 165/80.3 |
| 5,946,188 A | * | 8/1999 | Rochel et al. ........... 165/80.3 |
| 6,031,720 A | | 2/2000 | Crane et al. |
| 6,034,871 A | * | 3/2000 | Cheng ................. 165/104.34 |
| 6,034,873 A | * | 3/2000 | Stanghl et al. ........... 165/80.3 |
| 6,113,485 A | * | 9/2000 | Marquis et al. .......... 165/80.3 |
| 6,130,820 A | * | 10/2000 | Konstad et al. .......... 165/80.3 |
| 6,145,586 A | * | 11/2000 | Lo ....................... 165/80.3 |
| 6,230,789 B1 | * | 5/2001 | Pei et al. ................ 165/80.3 |
| 2002/0071250 A1 | | 6/2002 | Shih | |

* cited by examiner

*Primary Examiner*—Christopher Atkinson
(74) *Attorney, Agent, or Firm*—Blake, Cassels & Graydon LLP

(57) ABSTRACT

A heat removal system comprising a gas supply, a duct, and a heatsink is presented. The gas supply may be realized as a fan, a blower, or a compressed gas source and is located remotely from the heatsink. The duct provides a passageway for delivering high velocity gas from the gas supply to the first heat sink. The duct includes a plurality of vanes for reducing the turbulence and air boundary separation within the duct. The heatsink is in thermal communication with a heat-producing device such as a microprocessor.

10 Claims, 3 Drawing Sheets

HEAT REMOVAL SYSTEM

CROSS-REFERENCE TO RELATED APPLICATIONS

This application claims priority under 35 U.S.C. §119(e) to provisional patent application serial No. 60/311,215 filed Aug. 9, 2001; the disclosure of which is incorporated by reference herein.

FIELD OF THE INVENTION

The present invention relates generally to heat removal systems and more particularly to heat removal systems for use with integrated circuits (ICs) and printed circuit boards.

BACKGROUND OF THE INVENTION

As is known in the art, there is a trend to reduce the size of semiconductor devices, integrated circuits and microcircuit modules while at the same time having the devices, circuits and modules perform more functions. To achieve this size reduction and increased functionality, it is necessary to include a greater number of active circuits, such as transistors for example, in a given unit area. As a consequence of this increased functionality and dense packaging of active devices, such devices, circuits and modules (hereinafter collectively referred to as "circuits") use increasingly more power. Such power is typically dissipated as heat generated by the circuits.

This increased heat generation coupled with the need for circuits to have increasingly smaller sizes has led to an increase in the amount of heat generated in a given unit area. To further exacerbate the problem, the circuits are often densely mounted on printed circuit boards.

This increase in the amount of heat generated in a given unit area has led to a demand to increase the rate at which heat is transferred away from the circuits in order to prevent the circuits from becoming damaged or destroyed due to exposure to excessive heat. To increase the amount of heat which such circuits can withstand, the circuits can include internal heat pathways which channel or otherwise direct heat away from the most heat-sensitive regions of the circuits.

Although this internal heat pathway technique increases the amount of heat which the circuits can withstand while still operating, one problem with this internal heat pathway technique is that the amount of heat generated by the circuits themselves often can exceed the amount of self-generated heat which the circuits can successfully expel as they are caused to operate at higher powers. Furthermore, other heat generating circuit components mounted on printed circuit boards proximate the circuits of interest further increase the difficulty with which heat can be removed from heat sensitive circuits. Thus, to increase the rate at which heat is transferred away from the circuits, a heatsink is typically attached to the circuits.

Such heatsinks typically include a base from which project fins or pins. The fins or pins are typically provided by metal extrusion, stamping or other mechanical manufacturing techniques. The heatsinks conduct and radiate heat away from the heat generating and thermally vulnerable regions of circuits. To further promote the heat removal process, fans are typically disposed adjacent the heatsink to blow or otherwise force air or gas through the sides of the fins or pins of the heatsink.

One problem with this approach, however, is that the amount of air or other gas which a fan or blower can force through the heatsink fins/pins is limited due to the significant blockage of gas flow pathways due to the fins/pins themselves. Furthermore, in a densely populated printed circuit board (PCB) or multi-circuit module (MCM), other circuit components and mechanical structures required to provide or mount the PCB or module present additional blockage to gas pathways and also limits the amount of gas flow through the heatsink thus limiting the effectiveness of the heatsink. Another approach has been to couple the fan directly on top of the heatsink, however the resulting assembly has significant height which makes this approach unusable in certain applications. Another approach has been to couple the fan directly on top of the heatsink, however the resulting heatsink and fan combination has significant height which makes this approach unusable in many applications.

The ability of such conventional heatsinks and heatsink fan assemblies is limited and is not sufficient to remove heat as rapidly as necessary to ensure reliable operation of state of the art devices, circuits and modules having increased thermal cooling requirements. It would, therefore, be desirable to provide a heat removal system which is capable of removing an amount of heat which is greater than the amount of heat removed by conventional heatsinks and to do so in a minimal amount of space and without significant expense. Additionally, it would be desirable to provide Electro-Magnetic Interference (EMI) protection in conjunction with the removal of heat from semiconductor devices, integrated circuits and microcircuit modules. Further it would be desirable to provide a heat removal system having a low profile.

SUMMARY OF THE INVENTION

In accordance with the present invention, a heat removal system comprises a gas supply such as a fan, a blower or a compressed gas source which is coupled to a first end of a duct. The second end of the duct is disposed about an axial fin heatsink. The duct includes a plurality of vanes disposed therein which enable the system to recover energy loss and provide more air through the system, which provides a concomitant increase in the cooling ability of the system. The vanes reduce turbulence and prevent boundary layer separation, thereby providing a maximum amount of gas flow to the heatsink. With this particular arrangement, a heat removal system which rapidly removes heat from devices, circuits and modules including high power CPU chips and custom ASICS is provided.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

Figure 1:
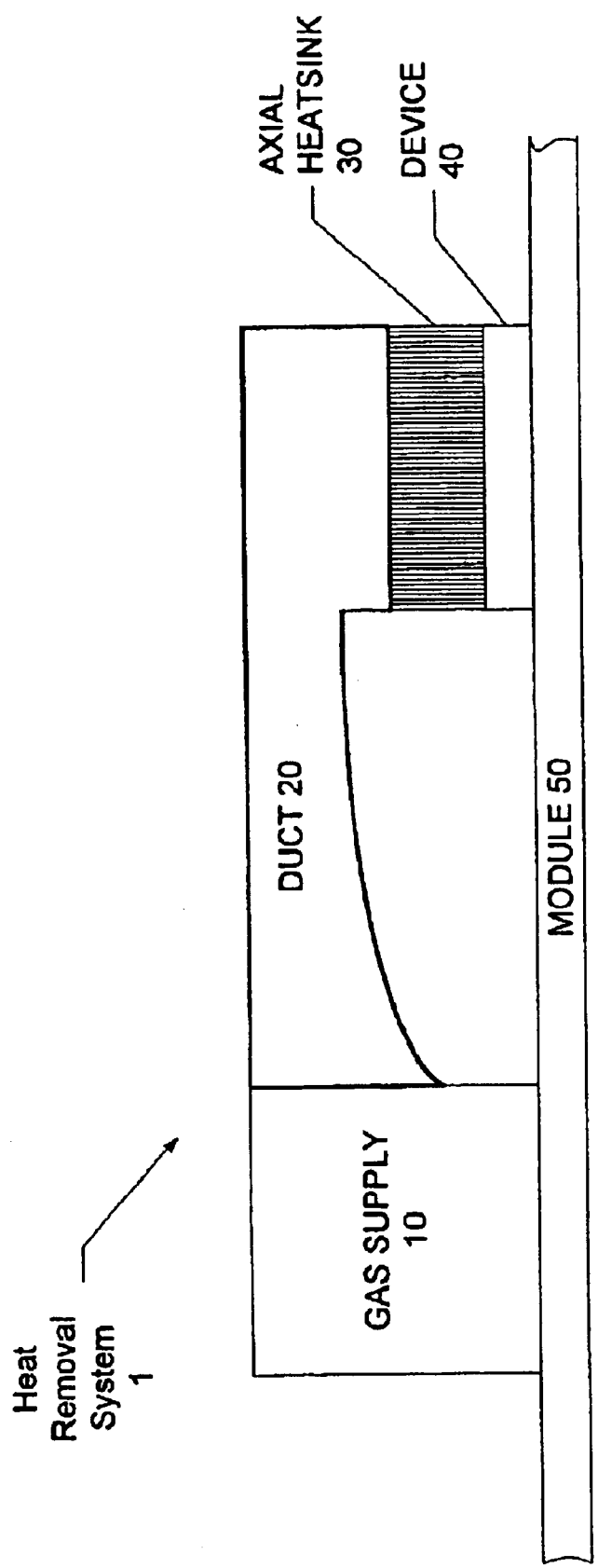
FIG. 1 is a side view of a heat sink assembly of the present invention.
Figure 2:
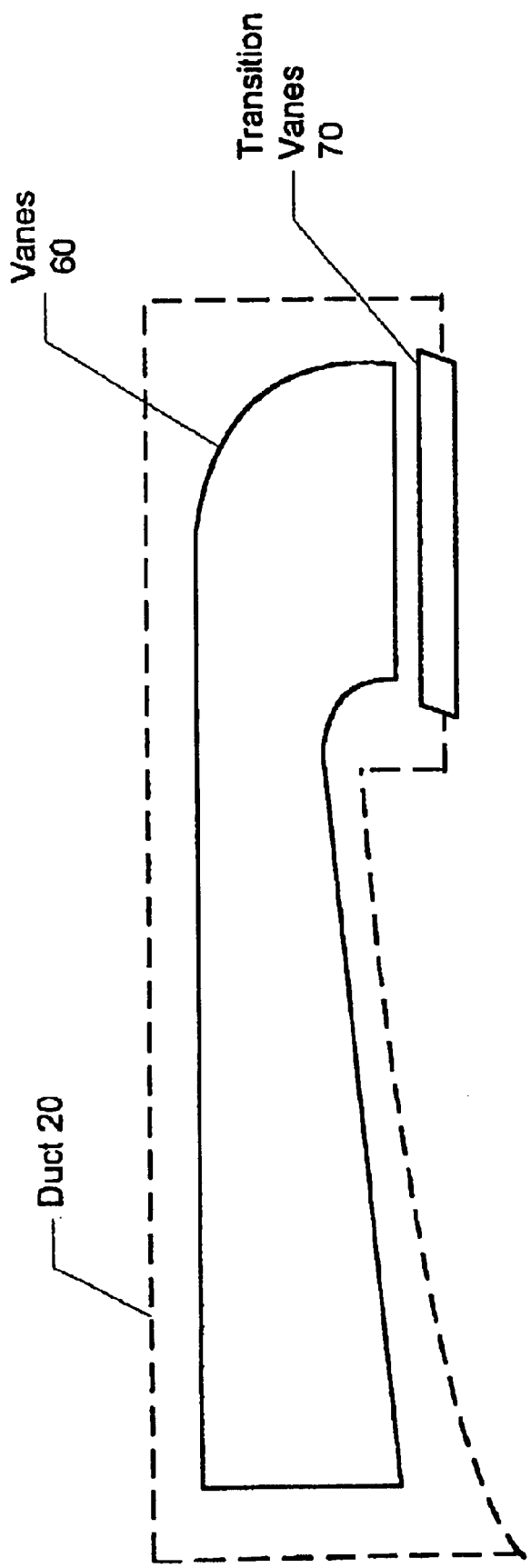
FIG. 2 is a sectional view of a duct shown in FIG. 1 showing a vane.
Figure 3:
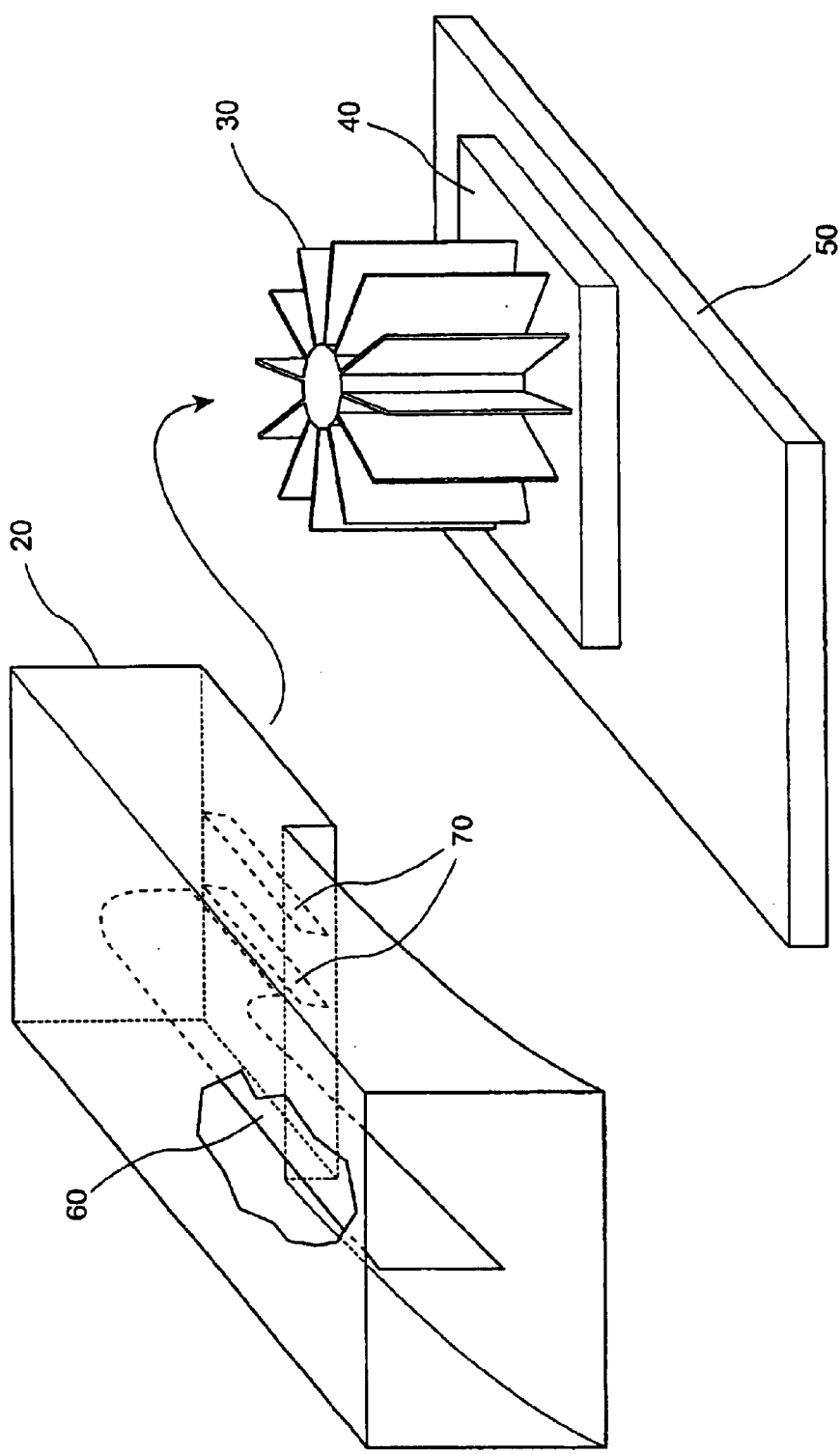
FIG. 3 is an exploded perspective view of the heat sink assembly of FIG. 1.

Referring now to FIGS. 1, 2 and 3 in which like elements are provided having like reference designations throughout the several views, a heat removal system 1 is shown. The heat removal system includes a gas supply 10, a duct 20 and a heatsink 30. Heatsink 30 is coupled to and in thermal communication with a device 40 mounted on a module 50. The heat removal system 1 may be coupled to any type of integrated circuit package including, but not limited to, dual-in-line packages (DIP), leaderless chip carriers, leaded chip carriers, flat packs, pin-grid arrays as well as other surface mount packages and small outline integrated circuit packages for surface-mounting.

As shown in FIGS. 1 and 3, the gas supply source 10 is coupled to the heatsink 30 and the heat-generating device 40 by way of duct 20. Unlike prior art systems, the gas supply 10 is located remotely from the device or devices being cooled. The gas supply 10 may be realized as a fan, a blower, a compressed gas source or other type of gas mover. By locating the gas mover 10 remotely from the device being cooled 40, a larger gas mover can be utilized, thereby providing larger volumes of gas to cool the device 40. In the preferred embodiment, the gas mover 10 comprises a "squirrel cage" type blower.

Remotely locating the gas mover from the heatsink allows a low profile to be obtained.

The present invention solves the problem of providing heat removal for a device that must be fit into a small space, unlike the prior art solutions. The typical size of a box that fits into a rack is known as a "U" which is equal to about 1.75 inches in height. Presently, there exist needs for cooling solutions which fit within a 1U, 2U, 3U and 4U box. The present invention fits within a 1U box and can be implemented on a top side of a module and on a bottom side of a module within a 2U or bigger box.

In this particular embodiment, the heatsink 30 is provided in a circular shape. Those of ordinary skill in the art should appreciate that other shapes may also be used. In a preferred embodiment the heatsink is provided as a folded fin device having a plurality of ridges and troughs which define a plurality of spaced fins. A sidewall of the fin includes at least one aperture extending through the sidewall. The plurality of apertures is provided in a predetermined pattern, shape and size to provide the desired cooling. The top edges of the fins are closed, and the bottom edges of the troughs are also closed, thereby allowing the fin/trough combination to act as a plenum.

The apertures can be of any size or shape. Additionally, the material originally in the sidewall where the aperture is may not be completely removed, but merely bent displaced from the sidewall. This arrangement provides additional material for cooling as opposed to the embodiment wherein the original material in the sidewall is completely removed to form the aperture. Additionally, the portion displaced from the sidewall provides increased turbulence which breaks up boundary layers, thereby providing additional cooling.

The heatsink 30 may further include a thermally conductive member. A first surface of the member is adapted to be in contact with an active portion of a heat-generating device 40 (e.g. an integrated circuit). Thus the folded fin stock is wrapped around the member and is in thermal communication with the member. Typically, the folded fin stock and member are provided from tinned copper or aluminum.

Ideally, the portion of the member in contact with the heat generating device 40 is provided having a shape which covers as much as possible the active area of the heat generating device. In one embodiment, the member is machined flat and a thermal interface material is disposed on the surface of the member which will be in contact with the heat generating device. Thus, for example, in the case where the heat-generating device is an IC which itself includes an internal heat sink, the member should cover the internal heat sink of the IC.

Also, it may be desirable or necessary to provide folded fin members of the heatsink 30 as a single unitary piece or as more than one piece. The particular number of pieces from which heatsink 30 is provided may be selected in accordance with a variety of factors including but not limited to the particular application, the amount of heat which must be transferred away from heat generating devices, the amount of space available for mounting of the heat sink and other components, the particular material from which the heatsink pieces is provided, the particular manufacturing techniques used to fabricate heatsink and the cost of manufacturing the heatsink.

In an exemplary embodiment, the thermally conductive member is provided having a substantially circular shape, other shapes, including, but not limited to, rectangular, circular, oval, square, triangular, rhomboidal and irregular shapes, may also be used. The particular shape of the member will be selected in any particular application in accordance with a variety of factors including but not limited to the shape of the folded fin member and the shape of the particular part being cooled and the amount of area available for mounting of the heat sink.

Referring now to FIG. 2, duct 20 is shown in cross-section. Duct 20 includes at least one vane 60 disposed therein. The vanes 60 are designed to reduce the turbulence within the duct 20, to prevent or reduce air boundary separation within the duct, and to maintain the velocity head pressure. The vanes 60 minimize the discontinuities in the airflow through the duct. As a result, a high pressure, generally uniform stream of gas is provided by the duct 60 to heatsink 30. The vanes 60 are preferably solid pieces having a smooth finish in order to minimize turbulence. Transition vanes 70 may also be incorporated at the end of the duct.

As shown in FIG. 1 duct 20 is coupled to gas mover 10. The gas velocity coming out of the gas mover 10 is non-uniform across the output of the gas mover. Accordingly, the duct 20 should be carefully matched to the fan to prevent large pressure drops from occurring. The incorporation of vanes 60 within the duct 20 keep the gas flow attached, thus the separation and turbulence are minimized as is the loss of velocity head pressure. The duct 20 and vanes 60 allow the gas flow from gas mover 10 to become evenly distributed, therefore making the useable output of the gas mover as large as possible.

Duct 20 may be provided in any desired shape as long as the duct provides a passageway for the gas exiting the gas mover to the heatsink. The vanes 60 may be provided having any shape which prevents or reduces flow separation of the gas within the duct. The particular shape of the duct and the vanes will be selected in any particular application in accordance with a variety of factors including but not limited to the amount of gas flow being utilized, the size of the device being cooled and the amount of cooling required to cool the particular device.

A heat removal system as shown and described herein may be provided with the heatsink disposed over a first surface of an integrated circuit which is disposed on a printed circuit board. Disposed between a first surface of a circuit and a first surface of a heatsink is a sheet of a thermally conductive matrix material. The matrix material facilitates an extraction of heat from the circuit to the heatsink.

It should also be noted that in some applications it may be desirable to mount the circuit on the printed circuit board prior to placing the heatsink/thermally conductive matrix material assembly on to the circuit. It should also be noted that in some applications it may be desirable to apply the thermally conductive matrix material first to the surface of the circuit and then to mount the heatsink to the circuit/thermally conductive matrix assembly and then mount the assembly on the PCB.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims.

All publications and references cited herein are expressly incorporated herein by reference in their entirety.

We claim:

1. A heat removal system comprising:
    a heatsink capable of being thermally coupled to a heat producing device; and
    a duct having a first end having a first opening and a second end having a second opening, the first end capable of being coupled to a gas supply remotely located from said heatsink, the second end disposed adjacent said heatsink, at least one vane disposed within said duct, said at least one vane arranged to reduce turbulence and to reduce airflow separation within said duct, and at least one transition vane at said second end of said duct.

2. The heat removal system of claim 1 wherein said heatsink comprises an axial heatsink.

3. The heat removal system of claim 1 wherein said heatsink comprises a folded fin heatsink.

4. The heat removal system of claim 1 further comprising a gas source coupled to the first end of said duct.

5. The heat removal system of claim 4 wherein said gas source is selected from the group consisting of a fan, a blower, and a compressed gas supply.

6. The heat removal system of claim 1 wherein said vanes are solid.

7. The heat removal system of claim 1 wherein said vanes have a smooth finish.

8. The heat removal system of claim 1 wherein said duct comprises an EMI shield.

9. The heat removal system of claim 1 wherein said first end is located at one end of said duct and second end is located a second end of said duct.

10. The heat removal system of claim 9 wherein said first end is further located on a side of said duct and second end is further located on a bottom of said duct.

* * * * *